United States Patent [19]

Mikoshiba et al.

[11] Patent Number: 5,225,273

[45] Date of Patent: Jul. 6, 1993

[54] TRANSPARENT ELECTROCONDUCTIVE LAMINATE

[75] Inventors: Hitoshi Mikoshiba; Shinji Arai, both of Hino; Nobuo Suzuki, Akishima; Kunihiko Teranishi, Iwakuni, all of Japan

[73] Assignee: Teijin Limited, Osaka, Japan

[21] Appl. No.: 635,448

[22] Filed: Dec. 28, 1990

[30] Foreign Application Priority Data

Dec. 28, 1989 [JP] Japan .................. 1-338287
Mar. 7, 1990 [JP] Japan .................. 2-53842

[51] Int. Cl.⁵ .............................. B32B 5/14
[52] U.S. Cl. .............................. 428/323; 428/325; 428/327; 428/328; 428/329; 428/446; 428/212; 428/216; 428/697; 428/701; 428/411.1; 428/412; 428/480; 428/917
[58] Field of Search .......... 428/212, 428, 446, 323, 428/325, 327, 328, 697, 701, 216, 329, 411.1, 917, 480, 412

[56] References Cited

U.S. PATENT DOCUMENTS

| | | | |
|---|---|---|---|
| 2,825,687 | 3/1958 | Preston et al. | 204/192 |
| 3,847,659 | 11/1974 | Sobajima et al. | 117/211 |
| 4,010,291 | 3/1977 | Katsube et al. | 427/126 |
| 4,065,600 | 12/1977 | King et al. | 428/432 |
| 4,172,020 | 10/1979 | Tisone et al. | 204/192 |
| 4,336,119 | 6/1982 | Gillery | 204/192 |
| 4,345,000 | 8/1982 | Kawazoe et al. | 428/212 |
| 4,379,040 | 4/1983 | Gillery | 204/192 |
| 4,400,254 | 8/1983 | Freller et al. | 204/192 |
| 4,512,864 | 4/1985 | Gillery | 204/192 |
| 4,661,229 | 4/1987 | Hemming et al. | 204/192 |
| 4,765,729 | 8/1988 | Taniguchi | 428/328 |
| 4,786,570 | 11/1988 | Yu | 430/58 |
| 4,835,061 | 5/1989 | Ohta | 428/212 |
| 5,087,517 | 2/1992 | Sagawa | 428/329 |

FOREIGN PATENT DOCUMENTS 51-35431  10/1976  Japan.

*Primary Examiner*—Ellis P. Robinson
*Assistant Examiner*—Timothy M. Speer
*Attorney, Agent, or Firm*—Sughrue, Mion, Zinn, Macpeak & Seas

[57] ABSTRACT

A transparent electroconductive laminate having a transparent electroconductive layer composed mainly of indium oxide deposited on a transparent planar substrate, the electroconductive layer comprises two uniformly mixed phases comprising a crystalline phase of 1-80% by area and an amorphous phase of 99-20% by area and, in particular, the crystalline phase is composed of a grain or grains having a size of less than 1 μm and the crystal grain or grains are in at least one of an isolated state, a linked state and a state in which the crystal grain or grains are separated from each other by a network of the amorphous phase, whereby the laminate is suitable for an electrode of a transparent touch panel and an electroluminescent panel.

12 Claims, 1 Drawing Sheet

TRANSPARENT ELECTROCONDUCTIVE LAMINATE

BACKGROUND OF THE INVENTION

1. Field of the Invention

This invention relates to an electrically conductive laminate and production thereof. More particularly, the present invention relates to a transparent electroconductive laminate composed of a transparent electroconductive layer which is composed mainly of an indium oxide formed on a planar substrate.

2. The Prior Art

With the advent of the "informationalized society," there has been great progress in producing a device which utilizes both properties of optics and electronics, i.e., an optoelectronics device. According to the great popularization of the microcomputer, the innovations of instruments surrounding these microcomputers are extensively advanced. A transparent touch panel is widely used as an input unit, and a liquid crystal display and an electroluminescent display are becoming widely used as an output unit.

In the above-mentioned transparent touch panel, the liquid crystal display and the electroluminescent display, a transparent electrode is used and, in particular, a transparent electroconductive laminate, especially a transparent electroconductive plastic laminate, is used. A transparent electroconductive layer in the electroconductive laminate used for this purpose requires particularly excellent durability and stability of the electrical properties against mechanical stresses.

For the transparent electroconductive layer, a thin layer of a metal such as gold (Au), palladium (Pd), etc., a thin layer of a metal oxide such as indium-tin oxide (ITO), cadmium tin oxide (CTO), stannic oxide ($SnO_2$), titanium dioxide ($TiO_2$), etc. and a multi-layer thin film such as titanium oxide (TiOx)/silver (Ag)/titanium oxide (TiOx), etc. are well known. Among these films, a thin layer of a metal oxide is superior to others in principal properties such as transparency, electroconductivity, mechanical properties, etc. In the thin layers of a metal oxide, a layer mainly composed of an indium oxide is advantageous, and of those an indium tin oxide (ITO) layer is especially excellent in transparency and electroconductivity. This further attracts attention since it can be readily etched to a desired electrode pattern (superior etchability).

Various production methods for a transparent electroconductive film composed mainly of indium oxide have been proposed.

The conventional process for the production of the glass-based film comprises the spraying of a solution of tin tetrachloride in hydrochloric acid onto a glass sheet heated to several hundred degrees Celsius, followed by oxidation at high temperature to form a thin film of stannic oxide. A recently developed method uses indium oxide as an evaporation source which is deposited as a vapor on a glass sheet (heated normally to about 300° to 350° C.) in a high degree of vacuum in the range of from $10^{-4}$ to $10^{-5}$ mmHg. Obviously, either method requires the heating of the glass base to high temperatures, as does another known method which supplies the vacuum system with water vapor or a gas that contains water vapor. The last mentioned method aims at forming an electrically conductive film of low resistivity, for example, 100 ohms/cm$^2$ or less, but even that method requires heating of the glass base to a temperature between 300° and 350° C. In short, the heating of the glass base is indispensable to the manufacture of a desired glass-based electrically conductive film in the conventional technique, and apparently, such a technique is not applicable to the production of a thin electrically conductive film using a plastic base. The thus obtained indium oxide-based transparent electroconductive layer was a completely crystallized layer.

Several methods have been proposed to solve the stated problem, and most of them rely on a vacuum vapor deposition process using either indium oxide or indium as a primary evaporation source.

Examples of a method using indium oxide as an evaporation source are described in Japanese Patent Publication Nos. 35431/76 and 37667/76 wherein an indium oxide vapor is deposited on a plastic base in a high degree of vacuum (i.e., less than $1 \times 10^{-3}$ mmHg, typically between $1 \times 10^{-4}$ to $1 \times 10^{-5}$ mmHg) that was either unheated or heated to a suitable temperature tolerable to the plastic base, followed by oxidative treatment under heating primarily in an oxidizing gas atmosphere. However, this method demands relatively severe conditions for the oxidation treatment that follows the vacuum deposition of indium oxide vapor; for example, the optimum temperature for heat treatment in air for a practical period is between 200° and 250° C. or higher. During vacuum deposition, indium oxide is decomposed to lower oxides, so the purpose of oxidative treatment is to convert them into higher oxides, but since the conditions for that treatment are severe, as mentioned above, only limited types of plastics can be used as the base. In addition, the indium oxide film thus prepared was also a completely crystallized layer.

The other method, that uses indium as an evaporation source, deposits the vapor of indium oxide on a plastic base that is formed by oxidizing indium in a vacuum system having a relatively low degree of vacuum (i.e., ca. $2 \times 10^{-2}$ to $1 \times 10^{-4}$ mmHg) which is being supplied with an oxidizing gas.

Japanese Patent Publication No. 14304/65 describes a method that facilitates the conversion of indium to indium oxide by heating the plastic base to at least 100° C., and typically between about 110° and 150° C., before vacuum deposition. Japanese Patent Publication No. 8137/68 describes a method wherein a thinner film of vapor deposit is provided by performing deposition at a rate higher than 16 Å/sec, typically higher than 50 Å/sec, and after the deposition, the film is held at a temperature of around 100° C. for several hours to promote the conversion of indium to an oxide form. The indium oxide layer produced by the above-mentioned method was produced at an extremely low oxidation level and the transparency was very poor.

In U.S. Pat. No. 4,345,000 a transparent electrically conductive film and processes for the production thereof are described, the film comprising a metallic oxide wherein the metallic component comprises from 60 to 95 wt % indium and from 40 to 5 wt % tin formed on the surface of a plastic base, wherein the weight ratio of the tin to the indium changes continuously from the outer surface to the inner surface in such a manner that the ratio on the inner surface of the film is appreciably lower than the average ratio of the film and the ratio on the outer surface of the film is appreciably higher than the average ratio of the film. This invention provides an electroconductive film with a high transmittance by such a specific structure.

Cathode sputtering has also been used to form oxide films of the aforesaid metals, particularly indium oxide films. Some of these previous methods of producing sputtered indium oxide films rely on the oxidation of the cathode and the sputtering of this oxide to produce the film. The rate of sputtering is limited by the rate of oxidation of the cathode.

Another method of obtaining indium oxide films is described in U.S. Pat. No. 2,825,687 to Preston. In this patent, indium or another metal oxide is sputtered or the metal is sputtered in an atmosphere containing only a trace of oxygen to produce a colored or opaque film, and the film is subsequently heated in air to develop a permanent conductivity and improve film transmission. The indium oxide-based transparent electroconductive layer obtained this method was also a completely crystallized layer.

U.S. Pat. No. 4,010,291 discloses a method of making low resistance indium oxide conductive films on a substrate by a vacuum evaporation or sputtering process using indium oxide or metallic indium as a starting material in a chamber having an atmosphere comprising an aqueous vapor or gas mixed with an aqueous vapor.

Low resistance indium oxide conductive films made by the invention have the feature that the transmission factor is lowered greatly in the near infrared range so that it is possible to produce infrared selective indium oxide reflecting films of superior performance with good reproducibility; however, this does not disclose any suggestion to produce a highly durable and stable film of the present invention.

Further, U.S. Pat. Nos. 4,065,600, 4,172,020, 4,336,119, 4,379,040, 4,400,254, 4,512,864 and 4,661,229 disclose production methods for an indium oxide-based transparent electroconductive layer by sputtering; however, none suggests the present invention.

The present invention was accomplished by finding and resolving a practical and great problem whereby a transparent electroconductive laminate prepared by depositing an indium-tin oxide layer by sputtering often suffered from the occurrence of disconnection in the sticking process of the transparent electroconductive film to an emitting layer by heat-compression when used as a transparent electrode of an electroluminescent panel.

SUMMARY OF THE INVENTION

The object of the invention is to provide a transparent electroconductive laminate which exhibits high durability when exposed to mechanical stresses and which enables the maintenance of stable electrical properties.

Another object of the invention is to provide a transparent electroconductive laminate which exhibits good adherence when used as a transparent electrode of, for example, an electroluminescent panel.

Still another object of the invention is to provide a transparent electroconductive laminate which results in a high efficiency electroluminescent display when used as a transparent electrode for an electroluminescent panel.

A further object of the invention is to provide a production method for the above-mentioned transparent electroconductive laminate.

These above-mentioned objects and others can be accomplished with a transparent electroconductive laminate having a transparent electroconductive layer composed mainly of indium oxide deposited on a transparent planar substrate, the electroconductive layer is composed of two uniformly mixed two phases comprising a crystalline phase of 1~80% by area and an amorphous phase of 99~20% by area. Preferably, the crystalline phase is composed of crystal grains with a size of less than 1 $\mu$m, and the crystal grains are placed in a sea of the amorphous phase as an isolated or linked island and/or the crystal grains are separated from each other by a networked narrow way of the amorphous phase.

DESCRIPTION OF THE PREFERRED EMBODIMENTS

Figure 1:
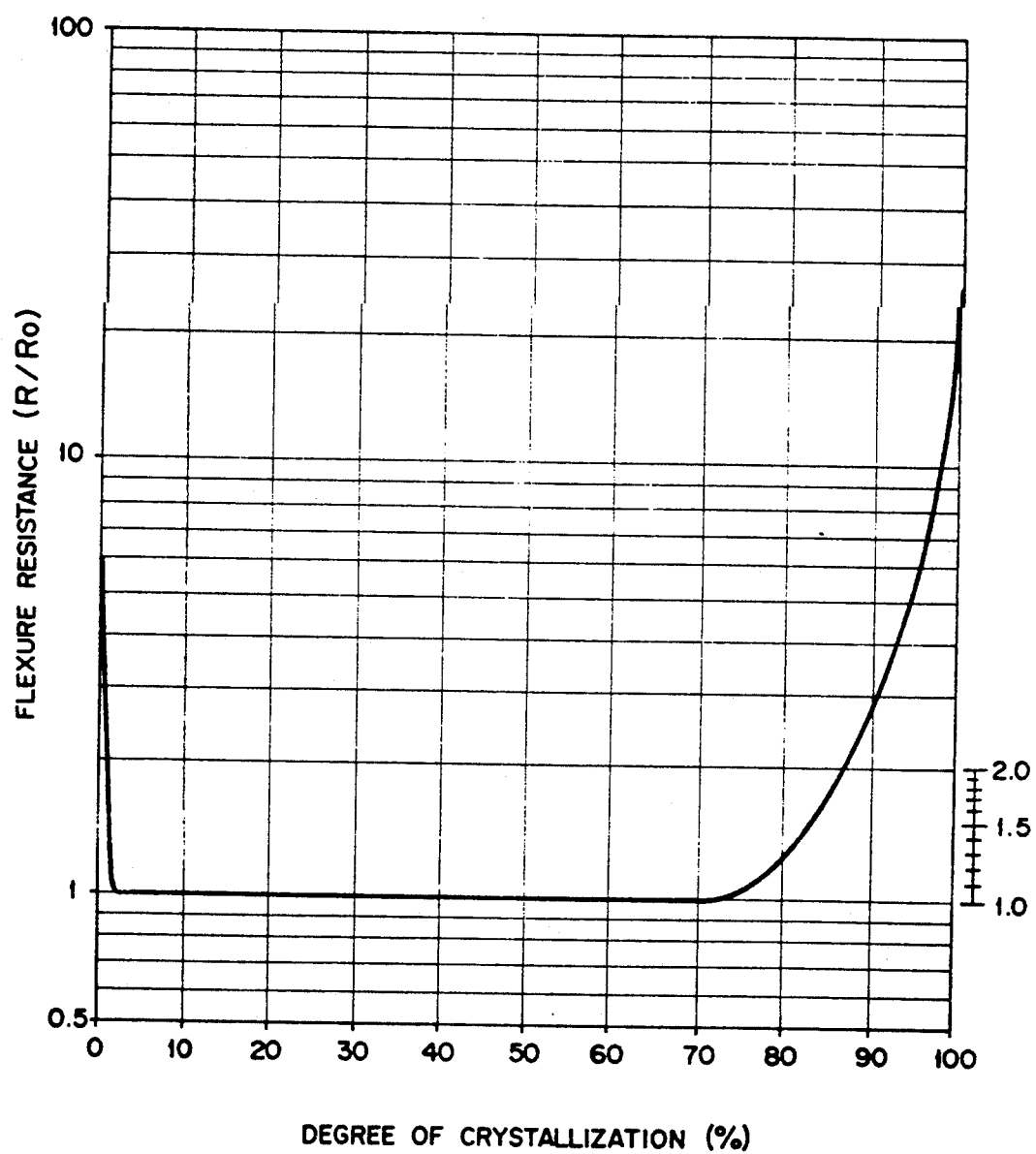
FIG. 1 is a graphical representation of the performance of the invention showing the flexure resistance vs. degree of crystallization.

The present invention is accomplished by investigating a relationship between a crystallization degree and a flexure resistance of the transparent electroconductive layer. The crystallization degree is represented herein by a ratio of the area of the crystalline phase observed with a transmission electron micrograph, and defined with the following equation:

Crystallization degree (%) = [Area of the crystalline phase ÷ (Area of the crystalline phase + Area of the amorphous phase)] × 100

Acceleration voltage: 200 KV
Magnification: 5,000×

The results are shown in FIG. 1. As is clear from the FIGURE, the layer with a 100% crystallized degree has an extremely low flexure resistance; however, the flexure resistance surprisingly increases rapidly by lowering the crystallization degree to less than 80%. The amorphous phase portion possibly contributes to buffer the stress of the boundary between the crystal grains. It is surprising that only an amorphous phase of 20% by area can exhibit a buffering effect.

On the other hand, the layer with a crystallization degree of less than 1% also has a low flexure resistance. Such layer results from an insufficient heat treatment and the stress may remain present just as sputtered.

For the reasons mentioned above, the transparent electroconductive layer composed mainly of indium oxide according to the present invention is the layer composed of both the crystalline phase and the amorphous phase uniformly mixed therein and has a crystallization degree of 1~80%.

An example of a transparent planar substrate in the present invention includes a molded article of an organic polymer. Any transparent organic polymer with a heat resistance can be used as the organic polymer composing the molded article with no special limitation. The heat resistance is usually higher than 100° C., preferably higher than 130° C. For example, a polyimide, a polyethersulfone, a polysulfone, a polyparabanic acid, a polyhydantoin and a polyallylate are preferred, and a polyester resin such as polyethylene-terephthalate, polyethylene-2,6-naphthalene dicarboxylate, polydiallylphthalate, and polycarbonate, and an aromatic polyamide and a cellulose triacetate are also preferred. These polymers may be homopolymers or copolymers and can be used singly or in combination.

The shape of the molded article of an organic polymer is not specifically limited; however, usually a sheet and a film are preferred and, of these, a film is particularly preferred since it can be wound up and allows a continuous process. When a film is used, the thickness of the film is preferably 6~500 μm, more preferably 12~200 μm.

These films or sheets may be added with a pigment or may be subjected to a surface treatment such as sandmat processing within a permissible degree of transparency.

These films or sheets may be used by themselves or after lamination.

Further, an undercoat layer may be applied on the molded article of an organic polymer to improve adherence with the transparent electroconductive layer before depositing the transparent electroconductive layer. For the undercoat layer, a layer formed by hydrolyzing an organic metal compound such as, for example, an organosilicic compound, a titanium alkyl ester, and a zirconium alkyl ester is preferably used. The undercoat layer may be formed in a multi-layer structure. The undercoat layer may be formed, for example, by coating a solution of an organic metal compound in an organic solvent such as lower alkanol, for example, methanol, ethanol, n- or i-propanol and butanol; a saturated aliphatic hydrocarbon or an aromatic hydrocarbon each having 5~10 carbon atoms, for example, a petroleum benzine, especially ligroin; or a mono-lower alkyl ether, especially mono-methyl- or mono-ethyl-ether, of glycols, especially ethylene glycol; or a mixture thereof; preferably ethanol, butanol, ligroin or ethylcellosolve or a mixture thereof, with a solid content of 0.5~2.7 wt %, preferably 0.5~2.4 wt %, on the molded article of an organic polymer, drying in the presence of water, and then hardening with heating, ion-bombardment, or ultraviolet radiation, or radiation with rays such as β-ray or γ-rays.

In coating the undercoat layer, a coating method using a known coating apparatus such as a doctor knife, a bar coater, a gravure roll coater, a curtain coater and a knife coater, a spray method or a dipping method can be employed depending on the shape of the molded article of an organic polymer and the property of the coating solution.

The thickness of the undercoat layer is preferably 100~1,000 Å, especially preferably 200~900 Å. When the thickness is less than 100 Å, it is difficult to form a continuous layer and to perform an improvement in adherence. On the other hand, when the thickness is higher than 1,000 Å, it becomes apt to cause undesirable cracking or exfoliation.

The above-mentioned undercoat layer may be formed on both sides of these films or sheets.

The transparent electroconductive laminate according to the present invention is one in which a transparent electroconductive layer with a specific structure is deposited on the above-mentioned substrate. In this context, the indium oxide may preferably be at various oxidation states, for example, $InO_{1.39}$~$InO_{1.49}$, more preferably $InO_{1.41}$~$InO_{1.48}$. Other components, (M), which may be contained in the indium oxide are Sn, Te, Cd, Mo, W or F, preferably Sn. The atomic ratio of this other component (M) to indium (In) may be M/In=2/98~20/80, preferably 2/98~12/88.

In the transparent electroconductive layer according to the present invention, there are a crystalline phase of indium oxide and an amorphous phase of indium oxide in a uniformly mixed state. A crystalline phase (or grain) can be observed as a white or black region of clear contrast with the aforementioned transmission electron microscopy. An amorphous phase can be observed as a gray region of weak contrast.

The transparent electroconductive layer according to the present invention has an area ratio for the crystalline phase (crystallization degree) of 1~80% by area, preferably 1~60% by area, more preferably 1~30% by area. When the ratio of the crystalline phase is small, the crystalline phase or the crystal grain exists in a sea of the amorphous phase as an isolated island. By increasing the ratio of the crystalline phase, it changes from the isolated island(s) to the linked island(s). When the crystalline phase begins to occupy a large portion, it looks like the individual linked crystal grain(s) is/are separated by a narrow partition wall of the amorphous phase and the whole crystal phase seems as if it is divided by the amorphous phase as a networked way. It is noted that the above explanation only illustrates primary features, and it should be apparent that these features may appear intermingled with each other in the course of change.

When the layer takes any one of the states mentioned above, the grain(s) of the crystalline phase have a size of less than 1 μm, preferably less than 0.5 μm. Larger grain size is not preferable because it tends to decrease the flexure resistance.

The transparent electroconductive layer above explained in detail according to the present invention has a thickness of 50~500 Å, preferably 100~400 Å.

Furthermore, the electroconductive laminate according to the present invention may be coated with a protecting layer on the transparent electroconductive layer composed mainly of indium oxide in order to improve scratching resistance or adhesion to other coated layers.

For such a protecting layer, a layer of a transparent metal oxide such as $TiO_2$, $SnO_2$, $SiO_2$, $ZrO_2$ and ZnO; a layer of a nitride such as $Si_3N_4$ and TiN; a layer of a transparent organic compound polymer such as acrylonitrile resin, styrene resin, acrylate resin, polyester resin or cyanoethylated resin such as cyanoethyl pullulan and cyanoethyl polyvinyl alcohol; or a polymeric layer formed, for example, by hydrolysis from an organometallic compound such as an organosilicic compound, titanium alkyl ester and zirconium alkyl ester can be used.

Additionally, the transparent electroconductive laminate according to the present invention can contain a layer improving adhesion between the indium oxide-based layer and other organic material. The adhesion improving layer can be used without limitation to the aforementioned specific transparent electroconductive layer composed mainly of indium oxide.

The adhesion-improving layer discussed above is a polymeric layer formed by hydrolysis of an organosilicic compound expressed by following formula (I):

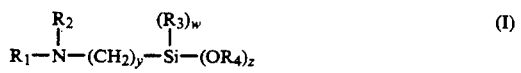

$$R_1-N-(CH_2)_y-Si-(OR_4)_z \quad (I)$$
with $R_2$ and $(R_3)_w$ substituents wherein $R_1$ represents a hydrogen atom, phenyl group, alkyl group having 1~4 carbon atoms or a group expressed by the formula

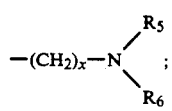

$$-(CH_2)_x-N\begin{matrix}R_5\\R_6\end{matrix};$$

$R_2$ represents a hydrogen atom or alkyl group having 1~4 carbon atoms; $R_3$ and $R_4$ independently represent alkyl group having 1~4 carbon atoms; y is an integer of 1~12; w is an integer of 0 or 1~2; z is an integer of 1~3; w+z=3; x is an integer of 1~12; $R_5$ and $R_6$ independently represent a hydrogen atom or alkyl group having 1~4 carbon atoms, which polymeric layer contains fine particles of a metal or a metal compound.

In formula (I), $R_1$ represents a hydrogen atom, phenyl group, alkyl group having 1~4 carbon atoms or a group expressed by the formula

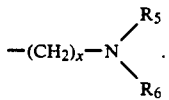

The alkyl group having 1~4 carbon atoms includes methyl and ethyl, for example. In formula (I), $R_5$ and $R_6$ independently represent a hydrogen atom, or an alkyl group having 1~4 carbon atoms such as methyl and ethyl. Further, $R_2$ represents a hydrogen atom or alkyl group having 1~4 carbon atoms. This alkyl group having 1~4 carbon atoms includes methyl and ethyl, for example. $R_3$ and $R_4$ independently represent an alkyl group having 1-4 carbon atoms. This alkyl group having 1-4 carbon atoms includes, for example, methyl and ethyl.

The organosilicic compound mentioned above may be converted into the polymeric layer of a polymer having a repeating unit expressed by the formula:

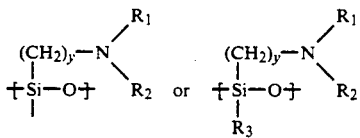

Preferred among these compounds is one exhibiting superior adhesion in the transparent electroconductive laminate according to the present invention, for example, a compound expressed by formula (I) in which $R_1$ and $R_2$ or $R_2$, $R_5$ and $R_6$ represent a hydrogen atom, that is, a compound having an amino group (—$NH_2$) as a functional group is preferable. Examples include compounds expressed by the following formulae:

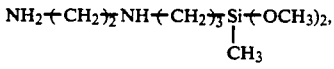

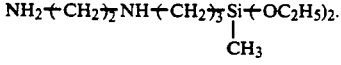

In addition to compounds expressed by the aforementioned formula (I), an oligomer (for example the oligomer having ≦10 degrees of association) formed by hydrolysis of these compounds can be used as the organosilicic compound in the present invention. Further, more than two (2) kinds of these compounds can be used.

As long as the effect of the present invention is not diminished, another organosilicic compound, an alkyl titanate and/or an alkyl zirconate can be added into the organosilicic compound expressed by the formula (I).

The organosilicic compound according to the present invention can be added, if necessary, with various additives such as a hardening catalyst, an adhesion promoter, a wettability modifier, a plasticizer, various stabilizers, a flame retarder and an antioxidant.

For the metal fine particle in the present invention, examples include a fine particle of ruthenium, rhodium, palladium, etc. For a fine particle of a metal compound, examples include a fine particle of a metal oxide such as antimonium-doped tin oxide, tin oxide, tin-doped indium oxide, indium oxide, silicon oxide, zinc oxide, aluminum oxide, yttrium-doped zirconium oxide, zirconium oxide, cerium oxide, and titanium oxide; a metal fluoride such as magnesium fluoride; and barium titanate, lead titanate, lead zirconate-titanate, lanthanum-doped lead zirconate-titanate, aluminum titanate, etc.

Of these, silicon oxide fine particles, whose surface is made hydrophobic or modified and which is readily dispersed in a hydrophobic solvent such as toluene in a colloidal level as a primary particle, are preferred.

The particle size is usually 100~1,000 Å, preferably 100~800 Å, when it can be dispersed as a primary particle.

From the viewpoint of stability of operation, a particle dispersed as the primary particle is preferred; however, a particle which can be dispersed as a secondary particle (an association state of the primary particles) can be used by controlling the operation in a suitable condition. In this case, it is preferably to use a particle which has a particle size as the secondary particle of 200~2,000 Å, preferably 200~1,600 Å, more preferably 200~1,000 Å.

The amount of the particle contained in the polymeric layer of the organosilicic compound is 27~72% by weight, preferably 30~70% by weight, more preferably 33~67% by weight based on the polymeric layer containing the particle.

The polymeric layer may have an average thickness preferably of 100~1,000 Å, more preferably of 100~500 Å. When the polymeric layer has an uneven surface by containing the particles, the thickness of the concave portion is preferably 50~150 Å and the thickness of the convex portion is preferably 150~1,500Å.

The polymeric layer formed by hydrolysis of the organosilicic compound containing fine particles of a metal or metal compound can enhance an adhesion of the laminate to other materials by mutual interaction between an increase of chemical affinity caused by a functional group of the organosilicic compound and an increase of an anchoring effect resulting from a concave-convex formation in the polymeric layer surface by including the fine particles of a metal or metal compound.

A fine particle of silicon oxide is particularly advantageous in the adherence-improving effect since the affinity and suitability of the particle for the organosilicic compound is so good that it can be dispersed uniformly in the polymeric layer, and it exhibits the maximum synergetic effect.

Further, when the transparent electroconductive laminate coated with the above-mentioned polymeric layer containing the fine particles is used as the transparent electrode of an electroluminescent panel, it can achieve superior effects such as an improvement of efficiency of the electroluminescent panel, a decrease in electric power consumption, and an elongation of the life of the electroluminescent panel, etc.

According to the invention, a layer of cyanoethylated resin with a thickness of 100~1,000 Å can be further formed on the layer of the amino group-containing alkylosiloxane polymer.

The transparent electroconductive laminate according to the present invention can be coated with a thin layer of at least one of metal and/or metal oxide selected from a group consisting of palladium, platinum, ruthenium, osmium, iridium, rhodium, gold, cobalt, silver, nickel, tungsten, iron and tin either on the above-mentioned transparent electroconductive layer directly or on the above-mentioned polymeric layer containing the fine particles. The thin layer of at least one metal and/or metal oxide selected from the group consisting of platinum, palladium, ruthenium, osmium, iridium and rhodium is more preferable. The metal and/or metal oxide can be used singly or as a mixture. The metal and/or metal oxide layer can also be used as a laminated structure.

The thickness of the metal and/or metal oxide layer is preferably more than 0.5 Å and less than 20 Å. A thickness of less than 0.5 Å is not effective in preventing degradation of the transparent electroconductive layer. On the other hand, a thickness of more than 20 Å is not preferable since the transparency is decreased.

These layers may be reasonably understood as the metal oxide layer even if it has been deposited as the metal layer when the layer is very thin.

The production of the transparent electroconductive laminate according to the present invention is illustrated below:

The production process according to the present invention starts from an intermediate transparent electroconductive laminate, that is, a transparent planar substrate coated with the intermediate layer composed mainly of an indium oxide having an absorption coefficient of $1.0 \times 10^{-5} \sim 3.9 \times 10^{-5}$ [Å$^{-1}$] at 550 nm and a specific resistance of $4.0 \times 10^{-4} \sim 1.4 \times 10^{-3}$ $\Omega$·cm. As for a method employed to prepare the layer having the above-mentioned properties, a sputtering process and an ion-plating process are mentioned, of these the sputtering process is preferably employed. In the sputtering process, an alloy containing indium as the main component such as an indium-tin alloy or a sintered article mainly composed of indium oxide, for example, a sintered article of indium oxide and tin oxide, are used as a target. A D.C. and/or R.F. magnetron method is preferred as the sputtering method since a plasma bombardment onto the substrate is weak and it allows high rate of deposition of the layer.

For an atmosphere gas under a magnetron sputtering method, a mixture gas of an inert gas such as argon gas with a reactive gas such as oxygen gas, for example, argon.oxygen mixture gas, can be employed for an alloy target composed mainly of indium, and a single inert gas such as argon gas or a mixture gas of an inert gas such as argon gas containing a very small amount of a reactive gas such as oxygen gas can be employed for a sintered target composed mainly of indium oxide. A preferred gas composition is Ar/O$_2$=85/15~75/25 for the former, and Ar/O$_2$=100/0~98/2 for the latter. The operating pressure during sputtering is preferably $(1 \sim 2) \times 10^{-3}$ Torr.

The intermediate layer according to the invention can be prepared by controlling the deposition rate under the condition within the above-mentioned preferable gas composition and operating pressure.

A preferred example is shown below:
Target: Indium.tin alloy (tin: 5 wt %)
Gas composition: Argon.oxygen mixture gas (Oxygen: 20 vol %)
Operating pressure: $1.2 \times 10^{-3}$ Torr
Deposition rate: 1,150~1,200 Å/min When the intermediate layer has an absorption coefficient of more than $4 \times 10^{-5}$ [Å$^{-1}$] and a specific resistance of more than $1.5 \times 10^{-3}$ $\Omega$·cm, it tends to cause great crystalline growth and formation of a final layer with a crystallization degree of 100% which has a low flexure resistance.

On the other hand, when the intermediate layer has an absorption coefficient of less than $1.0 \times 10^{-5}$ [Å$^{-1}$] and a specific resistance of less than $4.0 \times 10^{-4}$ $\Omega$·cm, the final layer after heat treatment will have a low electroconductivity.

The absorption coefficient [a] as used herein is defined by the following formula:

$$a = (1/t) \, log \, (100 - R - B) \, / \, T \, [\text{Å}^{-1}]$$

wherein T represents a transmittance factor (%) measured with an integral sphere at 550 nm wave length together with the substrate; R represents a reflectance factor (%) measured with an integral sphere at 550 nm wavelength together with the substrate; B represents an absorption factor (%) of the substrate such as the molded article of an organic polymer; and t represents a thickness (Å) of a layer composed mainly of indium oxide such as ITO layer.

The thickness of the intermediate transparent electroconductive layer composed mainly of indium oxide used in the present invention is preferably more than 50 Å and more preferably more than 100 Å in order to obtain a final product having a sufficient electroconductivity. In order to obtain the coated layer having sufficiently high transparency, the thickness is preferably less than 500 Å and more preferably less than 400 Å.

According to the process of the present invention, the intermediate layer composed mainly of indium oxide is deposited on, for example, the organic polymer film, if necessary via an undercoat layer, and it is subjected to heat treatment. There is no limitation for atmosphere under heat treatment. An oxygen atmosphere, an inert gas atmosphere or a reductive gas atmosphere may be employed; however, it is preferable to heat in air.

The temperature of the heat treatment is preferably 100°~250° C., more preferably 130~200° C. Heat treatment at lower than 100° C. cannot improve the flexure resistance. On the other hand, heat treatment at higher than 250° C. may result in undesirable deformation and cracking in the organic polymer film.

The period of heat treatment varies depending on the temperature of heat treatment, the composition of the layer etc. Higher temperature may reduce the period of heat treatment. For example, when a polyethylene terephthalate film is used as the transparent planar substrate and the intermediate electroconductive layer is the ITO layer, a treatment at 130°~180° C. for 0.1~12 hrs, preferably 0.1~8 hrs can achieve the purpose.

The aforementioned polymeric layer containing metal or metal compound fine particles according to the present invention can be formed by the method mentioned below:

A solution containing the organosilicic compound expressed by the above-mentioned formula (I) and/or the oligomer formed by hydrolysis of the compound and a solution containing colloidal fine particles of the above-mentioned metal or metal compound is mixed to form a coating liquid containing the organosilicic compound and fine particles of metal or metal compound, and the electroconductive laminate is coated with the resultant coating liquid on the above-mentioned transparent electroconductive layer and, if necessary, on the backside opposite to the electroconductive layer as well.

A solvent used to form the above-mentioned solution includes methanol, ethanol, i-propanol, n-propanol, butanol, methyl cellosolve, ethyl cellosolve, toluene, xylene, ligroin, acetone, methyl ethyl ketone, cyclohexanone, ethyl acetate, etc. Of these, ethanol, i-propanol, butanol, methyl cellosolve and toluene are preferable.

When a silicon oxide fine particle is used in the coating liquid according to the present invention, a solid component weight ratio of the particles to the organosilicic compound is preferably controlled in a range of 0.5/1~2/1. The solid component weight ratio either of lower than 0.5/1 or of higher than 2/1 is not preferred because the adhesion may be decreased. Even if the other metal or metal compound is employed, it is preferable to control the ratio within the range mentioned above.

After coating the above-mentioned coating liquid, it is heated and dried in the presence of water and hardened with heating, ion bombardment, ultraviolet radiation or radiation by radioactive rays such as $\beta$-rays or $\gamma$-rays to obtain the polymeric layer of the invention.

In coating the coating liquid, a coating method using a known coating apparatus such as a doctor knife, a bar coater, a gravure roll coater, a curtain coater and a knife coater, a spray method or a dipping method can be employed depending on the shape of the molded article of the organic polymer and the property of the coating liquid.

The thickness of the coating liquid is preferably 6~12 $\mu$m when the bar coater or the gravure roll coater is employed.

A method for preparing a thin layer of at least one metal and/or metal oxide selected from palladium, platinum, ruthenium, osmium, iridium, rhodium, gold, cobalt, silver, nickel, tungsten, iron and tin and oxide thereof deposited either on the above-mentioned transparent electroconductive layer directly or on the above-mentioned polymeric layer containing said fine particles includes known conventional methods. A physical vapor deposition method such as sputtering, ion plating and vacuum vapor deposition is preferably applied. As a target for sputtering and a vaporizing material for ion plating or vacuum vapor deposition, one metal or mixture of more than one metal selected from the above-mentioned metals can be used. An atmosphere gas under processing, argon gas, argon-oxygen mixture gas or nitrogen-oxygen mixture gas can be employed for sputtering or ion plating. Vacuum atmosphere or the gas atmosphere mentioned above can be employed for vacuum vapor deposition.

The obtained transparent electroconductive laminate according to the invention not only is suitable as an electrode for a transparent touch panel and an electroluminescent panel, but also is widely applicable to xerography, antistatic material, planar heater, electronic display device, optical memory, opto-electric converter, optical communication, opto-electronics, selective sunlight reflector, etc.

EXAMPLES

The invention will be illustrated in more detail with the following examples.

EXAMPLES 1-3 AND COMPARATIVE EXAMPLES 1-2

On both sides of the surface of a polyethylene terephthalate film of 75 $\mu$m thickness, a solution of a pentamer of an organosilicic compound expressed by the formula $H_2N-(-CH_2-)_3-Si-(-OC_2H_5)_3$ in a mixed solvent of ethanol, ligroin, butanol and ethyl cellosolve (concentration of the organosilicic compound =0.8% by weight; ethanol/ligroin/butanol/ethyl cellosolve=1.0/3.1/1.1/0.7 by weight) Was coated with a gravure roll coater and dried at 130° C. for 1 min. After drying, a hardened layer of the organosilicic compound had a thickness of 300 Å.

The thus obtained film was set at a prescribed place in D.C. magnetron sputtering apparatus and a vacuum vessel thereof was evacuated up to $2\times10^{-5}$ Torr. Then an Ar/O$_2$ mixture gas (O$_2$: 20 vol %) was introduced into the vessel and a pressure was adjusted at $1.2\times10^{-3}$ Torr. While maintaining the above pressure, an ITO layer having a 300 Å thickness was deposited on the film with reactive sputtering method using a target of In/Sn alloy (Sn: 5% by weight).

A deposition rate was controlled at 1,100 Å/min (Example 1), 1,150 Å/min (Example 2), 1,200 Å/min (Example 3), 1,400 Å/min (Comparative Example 1) or 1,150 Å/min (Comparative Example 2) in respective examples.

These samples except that of Comparative Example 2 were heat-treated in a hot-air dryer kept at 150° C. The heat-treated samples and non-treated sample of Comparative Example 2 were examined for their degree of crystallization, specific resistance, flexure resistance and degree of disconnection after attachment to an emitting layer.

The flexure resistance was defined as $R/R_0$, wherein $R_0$ means a resistance before a flexure resistance test; R means a resistance in an original form after a flexure resistance test of 10 times repeated deformation around a rod of 5 mm diameter 180° turn.

The results are shown in Table 1.

The transparent electroconductive laminates according to the invention have superior flexure resistance and cause no disconnection after being attached to an emitting layer.

TABLE 1

|  | Example | | | Example | |
|---|---|---|---|---|---|
|  | 1 | 2 | 3 | 1 | 2 |
| As sputtered | | | | | |
| specific resistance ($\Omega \cdot$ cm) | $5.6 \times 10^{-4}$ | $5.7 \times 10^{-4}$ | $6.2 \times 10^{-4}$ | $2.0 \times 10^{-3}$ | $5.7 \times 10^{-4}$ |
| absorption coefficient (Å$^{-1}$) | $1.8 \times 10^{-5}$ | $2.8 \times 10^{-5}$ | $3.5 \times 10^{-5}$ | $8.8 \times 10^{-5}$ | $2.8 \times 10^{-5}$ |
| Heat treatment period (hr) | 1 | 3 | 6 | 6 | 0 |
| After heat treatment | | | | | |

TABLE 1-continued

|  | Example | | | Example | |
| --- | --- | --- | --- | --- | --- |
|  | 1 | 2 | 3 | 1 | 2 |
| degree of crystallization (%) | 1.6 | 15 | 76 | 100 | 0 |
| specific resistance ($\Omega \cdot cm$) | $5.6 \times 10^{-4}$ | $6.0 \times 10^{-4}$ | $6.9 \times 10^{-4}$ | $3.6 \times 10^{-4}$ | — |
| flexure resistance ($R/R_0$) | 1.0 | 1.0 | 1.1 | 26.5 | 6.0 |
| disconnection after made stuck | no | no | no | yes | yes |

EXAMPLES 4-6 AND COMPARATIVE EXAMPLES 3 AND 4

Various coating liquids containing silicon oxide fine particles and an organosilicic compound at different ratios by weight as shown in Table 2 were prepared from:

(1) a solution of a trimer produced by hydrolysis of an organosilicic compound expressed by the molecular formula $H_2N-(-CH_2-)_2-NH-(-CH_2-)_3-Si-(-OC_2H_5)_3$ in a mixed solvent of ethanol, butanol and ethyl cellosolve (1.0/5.1/1.9 by weight), (2) a solution of colloidary dispersed silicon oxide fine particles (primary particle diameter = 120 Å) whose surface was made hydrophobic in toluene, and (3) isopropanol.

On the other hand, a polyethylene terephthalate film of 75 μm thickness was set at a prescribed place in D.C. magnetron sputtering apparatus and a vacuum vessel thereof was evacuated up to $2 \times 10^{-5}$ Torr.

Then an $Ar/O_2$ mixture gas ($O_2$: 20 vol %) was introduced in the vessel and a pressure was adjusted at $1.2 \times 10^{-3}$ Torr and then an indium tin.oxide layer with a thickness of 300 Å was deposited on the film at a deposition rate of 1,150 Å/min with reactive sputtering method using a target of In/Sn alloy (Sn: 5% by weight).

On the indium-tin oxide layer the aforementioned coating liquids were coated respectively at a liquid thickness of 11 μm with a bar coater and dried at 140° C. for 1 min. The obtained samples were then heat-treated in a hot-air dryer kept at 150° C. for 3 hours to form various transparent electroconductive laminates.

Separately, an aluminum sheet with a thickness of 100 μm was coated with a coating liquid composed of cyanoethyl pullulan, cyanoethyl polyvinyl alcohol and barium titanate powder dispersed therein (cyanoethyl pullulan/cyanoethyl polyvinyl alcohol/barium titanate powder = 35/15/50 by weight) and dried to form a reflective insulating layer with a thickness of 40 μm. Further, on the reflective insulating layer a coating liquid composed of cyanoethyl pullulan, cyanoethyl polyvinyl alcohol and phosphor powder composed mainly of zinc sulfide dispersed therein (cyanoethyl pullulan/cyanoethyl polyvinyl alcohol/phosphor powder = 10/10/80 by weight) was coated and dried to form an emitting layer with a thickness of 40 μm and afford a test sheet.

The transparent electroconductive layer of the transparent electroconductive laminate was set face to face with the emitting layer of the test sheet, and they were thermally laminated with a laminating apparatus with rollers which were adjusted at a temperature of 170° C. and a pressure of 15 kg/cm.

A 25 mm width sample was cut out for measurement and an adhesion between the transparent electroconductive layer and the emitting layer was measured with a universal testing machine model 4302 (INSTRON Ltd.). Conditions of the measurement were 180° for a peeling angle and 300 mm/min for a peeling velocity.

The results are shown in Table 2.

TABLE 2

|  | Total solid component (% by weight) | Solid component weight ratio $\left(\dfrac{\text{Silicon oxide fine particle}}{\text{Organosilicic compound}}\right)$ | Adhesion (g/25 mm width) |
| --- | --- | --- | --- |
| Example 4 | 0.7 | 0.6/1.0 | 250 |
| Example 5 | 0.7 | 1.3/1.0 | 350 |
| Example 6 | 1.1 | 1.9/1.0 | 220 |
| Comparative Example 3 | 1.6 | 2.7/1.0 | 10 |
| Comparative Example 4 | 0.9 | 0/1.0 | 60 |

It can be understood that the transparent electroconductive laminate according to the invention exhibits excellent adhesivity between the transparent electroconductive layer and the emitting layer.

EXAMPLE 7

A polyethylene terephthalate film with a thickness of 75 μm was set at a prescribed place in D.C. magnetron sputtering apparatus and a vacuum vessel thereof was evacuated up to $2 \times 10^{-5}$ Torr.

Then an $Ar/O_2$ mixture gas ($O_2$: 1 vol %) was introduced in the vessel and the pressure was adjusted at $1.3 \times 10^{-3}$ Torr and then an amorphous transparent electroconductive layer of indium-tin oxide with a thickness of 300 Å was formed on the film by sputtering using an ITO target ($SnO_2$=5% by weight).

On the transparent electroconductive layer thus prepared, the same coating liquid as in Example 5 was coated and dried at 140° C. for 1 minute to form a transparent electroconductive laminate.

The transparent electroconductive layer of the transparent electroconductive laminate thus obtained and the emitting layer of the same test sheet as used in Example 4 were thermally laminated in the same manner as in Example 4, and then the adhesion between the transparent electroconductive layer and the emitting layer was measured in the same way as in Example 4.

The result is shown in Table 3.

COMPARATIVE EXAMPLE 5

The transparent electroconductive laminate which had not yet been coated with a polymeric layer on the transparent conductive layer in Example 7 was used herein, and the transparent conductive layer thereof and the emitting layer of the same test sheet as in Example 7 were thermally laminated to measure the adhesion between the transparent electroconductive layer and the emitting layer in the same way as in Example 7.

The result is shown in Table 3.

TABLE 3

|  | Coating liquid | Adhesion (g/25 mm width) |
|---|---|---|
| Example 7 | same as in Example 5 | 300 |
| Comparative Example 5 | — | 50 |

The transparent electroconductive laminate according to the invention shows a superior adhesion to the emitting layer.

EXAMPLE 8

A transparent electroconductive laminate was prepared as set forth in Example 7 and it was further coated with the same coating liquid as in Example 5 on the backside surface opposite to that of the transparent electroconductive layer and dried at 140° C. for 1 minute.

The backside surface of the transparent electroconductive laminate thus prepared and an adhesive surface of a moisture trap film [DAISEL Co. ZS-135] were set face to face and they were thermally laminated with a laminating apparatus with rollers which were adjusted at a temperature of 120° C. and a pressure of 8 kg/cm.

Then a 25 mm width sample was cut out for measurement and an adhesion between the back surface of the transparent electroconductive laminate and the moisture trap film was measured with a universal testing machine model 4302 (INSTRON Ltd.).

Conditions of the measurement were 180° for a peeling angle and 300 mm/min for a peeling velocity.

The result is shown in Table 4.

COMPARATIVE EXAMPLES 6 AND 7

A transparent electroconductive laminate prepared by coating the same coating liquid as in Comparative Example 4 on the backside surface and dried at 140° C. for 1 minute (Comparative Example 6) and a transparent electroconductive laminate without the polymeric layer on the backside surface (Comparative Example 7) were thermally laminated respectively to the moisture trap film in the same way as in Example 8, and the adhesions thereof were measured.

The results are shown in Table 4.

TABLE 4

|  | Coating liquid | Adhesion (g/25 mm width) |
|---|---|---|
| Example 8 | same as in Example 5 | 1,000 |
| Comparative Example 6 | same as in Comparative Example 4 | 140 |
| Comparative Example 7 | — | 10 |

It is shown that the transparent electroconductive laminate according to the invention has an excellent adhesion to the moisture trap film.

EXAMPLE 9

On the 75 μm thick polyethylene terephthalate film [TEIJIN LIMITED, Type HSL] a transparent electroconductive layer composed of indium·tin oxide was formed in the same way as in Example 7. The same coating liquid as in Example 5 was coated on the transparent electroconductive layer thus formed and dried at 140° C. for 1 minute to prepare a transparent electroconductive laminate.

A coefficient of kinetic friction between the surface of transparent electroconductive layer and the backside surface opposite to that of the transparent electroconductive layer was measured according to ASTM D1894.

The result is shown in Table 5.

COMPARATIVE EXAMPLE 8

A transparent electroconductive laminate was produced in the same way as in Example 9 except for using a coating liquid same as that in Comparative Example 4 instead of a coating liquid same as that in Example 5.

A coefficient of kinetic friction between the surface of the transparent electroconductive layer and the backside surface opposite to that of the transparent electroconductive layer was measured in the same manner as in Example 9.

The result is shown in Table 5.

TABLE 5

|  | Coating liquid | Coefficient of kinetic friction |
|---|---|---|
| Example 9 | same as in Example 5 | 0.15 |
| Comparative Example 8 | same as in Comparative Example 4 | 0.55 |

It is shown that the transparent electroconductive laminate according to the invention is very slippery.

EXAMPLES 10-23

In accordance with the method set forth in Example 1, a hardened layer of the organosilicic compound was formed on the both sides of the surface of a 75 μm thick polyethylene terephthalate film and then an indium·tin oxide layer with a thickness of 250 Å was deposited on one surface of the hardened organosilicic compound layer.

Then Ar gas was introduced into the vessel and the pressure was adjusted at $4 \times 10^{-3}$ Torr, and an about 2 Å thick thin layer of various metal or metal alloy was respectively formed on the indium·tin oxide layer by sputtering using a corresponding metal or metal alloy target.

Then the same coating liquid as that of Example 5 was coated on the surface of the thin layer of metal or metal alloy with a bar coater and dried at 140° C. for 1 minute to form a polymeric layer, followed by heat-treatment in a hot-air dryer kept at 150° C. for 1 hour to produce a transparent electroconductive laminate.

The transparent electroconductive layer side surface and the emitting layer of the test sheet, which was the same as that of Example 4, were placed face to face and they were thermally laminated in the same way as in Example 4 to form a sample for a degradation test.

On the transparent electroconductive layer surface, a silver paste electrode had been previously printed and a 15 μm thick metal foil connected to the silver paste electrode as a terminal for external electrical power input had been placed, and both were held between the transparent electroconductive laminate and the test sheet.

Then another terminal for external electrical power input was arranged on the aluminum surface of the test sheet. An electrical power of 100 V, 400 Hz was applied to both terminals and lighting was continued for 15 hours in an atmosphere at 60° C. and 90% RH.

Degradation of the transparent electroconductive layer (discoloration) was then checked. The results (by a three-step evaluation) are shown in Table 6.

The three-step evaluation is as follows:
A: no discoloration
B: slight discoloration
C: substantial discoloration

TABLE 6

| | Metal thin layer | Discoloration of transparent electroconductive layer |
|---|---|---|
| Example 10 | palladium | A |
| Example 11 | platinum | A |
| Example 12 | platinum.rhodium alloy | A |
| Example 13 | ruthenium | A |
| Example 14 | osmium | A |
| Example 15 | iridium | A |
| Example 16 | rhodium | A |
| Example 17 | gold | B |
| Example 18 | cobalt | B |
| Example 19 | silver | B |
| Example 20 | nickel | B |
| Example 21 | tungsten | B |
| Example 22 | iron | B |
| Example 23 | tin | B |

It is shown that the transparent electroconductive laminate according to the invention has a superior resistance to degradation of the transparent electroconductive layer.

EXAMPLES 24 AND COMPARATIVE EXAMPLES 9-11

According to the method of Example 10, a polyethylene terephthalate film having a hardened organosilicic compound layer and an indium·tin oxide layer thereon was prepared, a palladium thin layer of 2 Å thick was deposited on the indium·tin oxide layer, and it was coated with a coating liquid as described in Example 5 thereon to form a polymeric layer and heat-treated to produce a transparent electroconductive layer (Example 24).

For the Comparative Examples, in one case, the transparent electroconductive layer without a deposition of a palladium thin layer was coated with a coating liquid as described in Example 10 (Comparative Example 9), in another case, the palladium thin layer was deposited on the transparent electroconductive layer, but the polymeric layer was not formed thereon (Comparative Example 10) and, in another case, neither the palladium thin layer nor the polymeric layer was formed thereon (Comparative Example 11).

The prepared transparent electroconductive laminates of Example 24 and Comparative Examples 9-11 were thermally laminated respectively with a test sheet by sticking the transparent electroconductive layer surface of the laminate to an emitting layer of the test sheet.

A silver paste electrode and the terminal applied to external electrical power were sandwiched in the same way as described in Example 10.

After arranging the terminal for the external electrical power input on the aluminum surface, moisture trap films [DAISEL Co. ZE-135] were attached to both sides of the surface of the above-mentioned unified samples by using the laminating apparatus in the same way as in Example 8.

Further, dampproof films [NITTO DENKI KOGYO Co. 4820] were attached to both outside surfaces of the moisture trap films by using the laminating apparatus with rollers which were adjusted at a temperature of 120° C. and a pressure of 4 kg/cm to unify them and afford an ELD (electroluminescent display).

With respect to the dampproof film, for the films that were larger in size than any of the transparent electroconductive laminate, the test sheet and the moisture trap film were used. Therefore, the edges of the dampproof film were attached to each other around the ELD to wrap the transparent electroconductive laminate, the test sheet and the moisture trap films in their entirety.

An electrical power of 100 V, 400 Hz was applied to both terminals of the ELD thus prepared and lighting was continued in an atmosphere at 60° C. and 90% RH. Then a time at which brightness decreased to ½ of the initial value (a half-life period of brightness) was determined and the results are shown in Table 7.

TABLE 7

| | Presence of the palladium thin layer | Presence of the polymeric layer | Half-line period of brightness (hr) |
|---|---|---|---|
| Example 24 | Yes | Yes | 160 |
| Comparative Example 9 | No | Yes | 70 |
| Comparative Example 10 | Yes | No | 80 |
| Comparative Example 11 | No | No | 40 |

It was shown that almost no discoloration was found in the transparent electroconductive laminate according to the invention and the half-life period of brightness was also extensively prolonged.

EXAMPLES 25 AND 26 AND COMPARATIVE EXAMPLE 12

A coating liquid as described in Example 25 having a total solid content of 0.7% by weight and a solid component ratio (silicon oxide fine particles/organosilicic compound) of 0.6/1.0 was prepared in the same way as in Example 4 except silicon oxide fine particles having a primary diameter of 450 Å were used. Further, a coating liquid as described in Example 5 and a coating liquid as described in Comparative Example 4 were respectively prepared to give three types of coating liquid in all.

On the other hand, according to the method described in Example 1, a polyethylene terephthalate film having a hardened organosilicic compound layer and an indium oxide layer with a thickness of 250 Å thereon was prepared, on which a 2 Å thick palladium oxide layer was further deposited in the same way as described in Example 10 except an argon/oxygen mixture gas (Ar/O$_2$=80/20) was used.

Then, according to the method described in Example 10, the above prepared film was coated with the coating liquid as described in Example 25, the coating liquid as described in Example 5 and the coating liquid as described in Comparative Example 4, respectively, to form three kinds of polymeric layers. By heat-treating in the same way as described in Example 10, the transparent electroconductive laminates of Examples 25 and 26 and Comparative Example 12 were obtained, respectively.

The surface of the transparent electroconductive laminate, in which the transparent electroconductive layer was deposited, and the emitting layer of the test sheet were attached to each other in the same way as described in Example 10 to unify them, wherein the silver paste electrode and the terminal for the external electrical power input were sandwiched in the same way as described in Example 10.

After arranging the terminal for the external electrical power input on the aluminum surface, moisture trap films [DAISEL Co. ZE-135] were attached to both surfaces of the above-mentioned unified sample in the same way as described in Example 24, and dampproof films [NITTO DENKI KOGYO Co. 4820] were further attached to the outside surface of the moisture trap films in the same way as described in Example 24 to unify them and afford an ELD.

An electrical power of 100 V, 1 KHz was applied to both terminals of the prepared ELD, and brightness, power consumption and efficiency were measured.

The results are shown in Table 8.

TABLE 8

| | Brightness (Cd/m²) | Power consumption (W/m²) | Efficiency (Cd/w) |
|---|---|---|---|
| Example 25 | 80.0 | 25.4 | 3.15 |
| Example 26 | 80.0 | 26.5 | 3.02 |
| Comparative Example 17 | 79.5 | 28.4 | 2.80 |

It is shown that the transparent electroconductive laminate according to the invention can improve the efficiency about 10% compared to conventional methods.

While the invention has been described in detail and with reference to specific embodiments thereof, it will be apparent to one skilled in the art that various changes and modifications can be made therein without departing from the spirit and scope thereof.

What we claim:

1. A transparent electroconductive laminate having a transparent electroconductive layer composed mainly of indium oxide deposited on a transparent planar substrate, said electroconductive layer comprises two uniformly mixed phases comprising a crystalline phase of 1-80% by area and an amorphous phase of 99-20% by area.

2. A transparent electroconductive laminate according to claim 1, wherein the crystalline phase comprises a crystal grain or grains having a size of less than 1 μm, and said crystal grain or grains are in at least one of an isolated state, a linked state and a state in which said crystal grain or grains are separated from each other by a network of the amorphous phase.

3. A transparent electroconductive laminate according to claim 2, in which the transparent electroconductive layer has a thickness of 50~500 Å.

4. A transparent electroconductive laminate according to claim 3, in which the transparent electroconductive layer is composed of an indium oxide containing an additive metal tin (Sn) in an atomic ratio to indium atom (Sn/In) of 2/98~20/80.

5. A transparent electroconductive laminate according to claim 1, in which a layer of an amino group-containing alkylsiloxane polymer with an average thickness of 100~1,000 Å is further arranged over the transparent electroconductive layer.

6. A transparent electroconductive laminate according to claim 5, in which the amino group-containing alkylsiloxane polymer has a repeating unit expressed by the formula

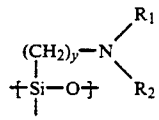

or the formula

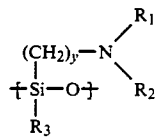

wherein $R_1$ represents hydrogen atom, phenyl group, alkyl group having 1~4 carbon atoms or group expressed by the formula

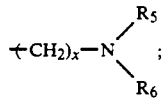

$R_2$ represents hydrogen atom or alkyl group having 1~4 carbon atoms; $R_3$ represents alkyl group having 1~4 carbon atoms; $R_5$ and $R_6$ respectively represent hydrogen atom or alkyl group having 1~4 carbon atoms; x is an integer of 1~12; and y is a integer of 1~12.

7. A transparent electroconductive laminate according to claim 6, in which the layer of an amino group-containing alkylsiloxane polymer contains metal or metal compound particles with a primary diameter of 100~1,000 Å dispersed therein.

8. A transparent electroconductive laminate according to claim 5, in which a layer of a cyanoethylated resin with a thickness of 100~1,000 Å is further formed on the layer of the amino group-containing alkylsiloxane polymer.

9. A transparent electroconductive laminate having a transparent electroconductive layer composed mainly of indium oxide disposed on a transparent planar substrate, said electroconductive layer has an absorption coefficient of $1.0 \times 10^{-5} \sim 3.9 \times 10^{-5}$ [Å$^{-1}$] at 550 nm and a specific resistance of $4.0 \times 10^{-4} \sim 1.4 \times 10^{-3}$ [Ω·cm] and can be converted to a layer composed of uniformly mixed two phases of a crystalline phase of 1~80% by area and an amorphous phase of 99~20% by area with heat-treatment at 100°~250° C.

10. A transparent electroconductive laminate according to claim 9, in which the transparent electroconductive layer has a thickness of 50~500 Å.

11. A transparent electroconductive laminate according to claim 10, in which the transparent electroconductive layer is composed of an indium oxide containing an additive metal tin (Sn) in an atomic ratio to indium atom (Sn/In) of 2/98~20/80.

12. A transparent electroconductive laminate according to any one of claims 1, 9, 5 or 7, in which a layer of a metal selected from Pt, Pd, Ru, Os, Ir or Rh or an oxide thereof with a thickness of 0.5~20 Å is disposed on the transparent electroconductive layer directly or on the layer of the amino group-containing alkylsiloxane polymer.

* * * * *